(12) United States Patent
Cheng et al.

(10) Patent No.: US 12,360,580 B2
(45) Date of Patent: Jul. 15, 2025

(54) ENVIRONMENTAL CONTROL SYSTEM FOR COMPUTING HARDWARE IN AN AUTONOMOUS DRIVING VEHICLE

(71) Applicant: Baidu USA LLC, Sunnyvale, CA (US)

(72) Inventors: Peng Cheng, Redmond, WA (US); Xu Zhou, San Francisco, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 367 days.

(21) Appl. No.: 17/903,269

(22) Filed: Sep. 6, 2022

(65) Prior Publication Data

US 2024/0077920 A1   Mar. 7, 2024

(51) Int. Cl.
  *G06F 1/20* (2006.01)
  *G05D 1/00* (2024.01)
(52) U.S. Cl.
  CPC ........... *G06F 1/206* (2013.01); *G05D 1/0088* (2013.01); *G06F 1/203* (2013.01)
(58) Field of Classification Search
  CPC ...... B60H 1/00271; B60H 2001/00307; B60R 13/0869; G05D 1/0088; G05D 22/02; G06F 1/203; G06F 1/206; H05K 7/20
  See application file for complete search history.

(56) References Cited

U.S. PATENT DOCUMENTS

| | | | | |
|---|---|---|---|---|
| 6,378,311 | B1* | 4/2002 | McCordic | F24F 5/0042 62/93 |
| 2009/0209193 | A1* | 8/2009 | Kloster | B60H 1/3204 454/241 |
| 2015/0109736 | A1* | 4/2015 | Joshi | H02K 7/006 361/700 |
| 2016/0006088 | A1* | 1/2016 | Boetcher | F28D 20/02 165/80.2 |
| 2017/0290205 | A1* | 10/2017 | Shepard | H05K 7/20936 |
| 2017/0361676 | A1* | 12/2017 | Androulakis | B60H 1/3204 |
| 2021/0086589 | A1* | 3/2021 | Shao | B60H 1/323 |

* cited by examiner

*Primary Examiner* — Kidest Bahta
(74) *Attorney, Agent, or Firm* — WOMBLE BOND DICKINSON (US) LLP

(57) ABSTRACT

Embodiments are disclosed of a thermal enclosure for use in an autonomous driving vehicle (ADV). The thermal enclosure includes an enclosure having a top, a bottom, and an interior compartment having a floor and a ceiling. The thermal enclosure is adapted to be mounted in the ADV. An electronic component is positioned in the interior compartment and thermally coupled to the floor. A cold plate having a bottom surface, a top surface, an inlet, and an outlet, is positioned in the interior compartment with the bottom surface of the cold plate thermally coupled to the electronic component and with a gap between the top surface of the cold plate and the ceiling. The cold plate's inlet and the outlet are adapted to be fluidly coupled to a cooling system outside the thermal enclosure.

20 Claims, 5 Drawing Sheets

ENVIRONMENTAL CONTROL SYSTEM FOR COMPUTING HARDWARE IN AN AUTONOMOUS DRIVING VEHICLE

TECHNICAL FIELD

The disclosed embodiments relate generally to environmental control systems for information technology (IT) equipment and more specifically, but not exclusively, to an environmental control device and system for computing hardware in an autonomous driving vehicle (ADV).

BACKGROUND

Mobile computing devices, whether hand-held, in a vehicle, or otherwise mobile, are now ubiquitous. Modern vehicles in particular have many onboard computers—so many that a vehicle is much like a mobile data center. Real data centers use extensive environmental control systems, such as air conditioning, to keep computing equipment in a tightly controlled environment—that is, ambient conditions such as temperature and humidity are kept within tightly controlled limits. But vehicles are subjected to highly variable ambient conditions, so that the interior compartments of a vehicle parked outdoors on a hot summer day can become very hot and humid, and on a cold winter day they can become very cold and dry. Vehicle environmental control systems exist mostly for passenger comfort and operate only when the vehicle is operating, making it difficult or impossible to keep a vehicle's onboard computers within tight environmental limits when the vehicle is exposed to ambient conditions. And even during vehicle operation, some compartments like the engine compartment are not cooled by the vehicle's environmental control system and can become quite hot. As a result, onboard computers positioned in vehicle compartments are also subjected to a wide range of temperatures, humidities, etc.

Exposure of electronics to extremely high and low temperatures, coupled with high humidity, can cause dysfunction, lifetime shortening, or permanent damage. For safety-critical computing hardware in autonomous driving systems—in particular, computing hardware for level four (L4) and level five (L5) fully autonomous driving (i.e., driverless) platforms, which have complicated circuit architectures and include a variety of functional components—reliability over a wide range of temperature and humidity is a critical consideration to ensure consistent performance, safety, and cost-efficiency.

Current practices to reduce or counter exposure of electronics to high/low ambient temperature includes selecting automotive-grade-compliant components and using air/liquid cooling apparatus to maintain components operating temperature with limits. Automotive-grade passive components, such as resistors and inductors, should comply with AEC Q200, ASILI/ISO 26262 Class B, IATF 16949, and active components, such as integrated circuits (ICs), should be compliant with AEC Q100, ASILI/ISO 26262 Class B, IATF 16949. For the operating temperature range, components should be good for −40 C to +150 C in the engine compartment and −40 C to +85 C in the passenger compartment. Air/liquid cooling systems are thermally coupled to active electrical components via direct contact, or via thermally conductive materials, as a result of which they dissipate heat generated during operation and maintain the components' temperatures. And to prevent damage to electrical components from moisture condensation, a protective coating such as a polyurethane-based coating can be applied to the printed circuit board assembly (PCBA) to achieve moisture resistance. But these current practices have some limitations:

1) Automotive-grade components are usually more expensive than industrial-grade and commercial-grade products. And for high-performance computing systems, such as L4 and L5 autonomous driving platforms, there may be no automotive-compliance components available in the market, thus limiting the design or decreasing the system's temperature tolerances.
2) Air/liquid cooling systems can efficiently control the component's temperature not to exceed the high limit, but they have no control for low-temperature storage when the system ceases operation or thermal shock from drastic ambient change or startup of the system from hibernation. Especially for the thermal shock, even if all components are automotive grade, the drastic and asynchronous temperature change will induce stress in solder joints, laminated layers, and encapsulated fillers, so that cracks or other damage can occur over multiple temperature cycles.
3) Anti-moisture coatings can degrade over time and over multiple thermal cycles. And the coatings cannot be applied to metal contacts of connectors, which require good electrical contact while still being exposed to liquid condensation.

BRIEF DESCRIPTION OF THE DRAWINGS

Non-limiting and non-exhaustive embodiments of the invention are described below with reference to the following figures, wherein like reference numerals refer to like parts throughout the various views unless otherwise specified.

DETAILED DESCRIPTION

Figure 1:
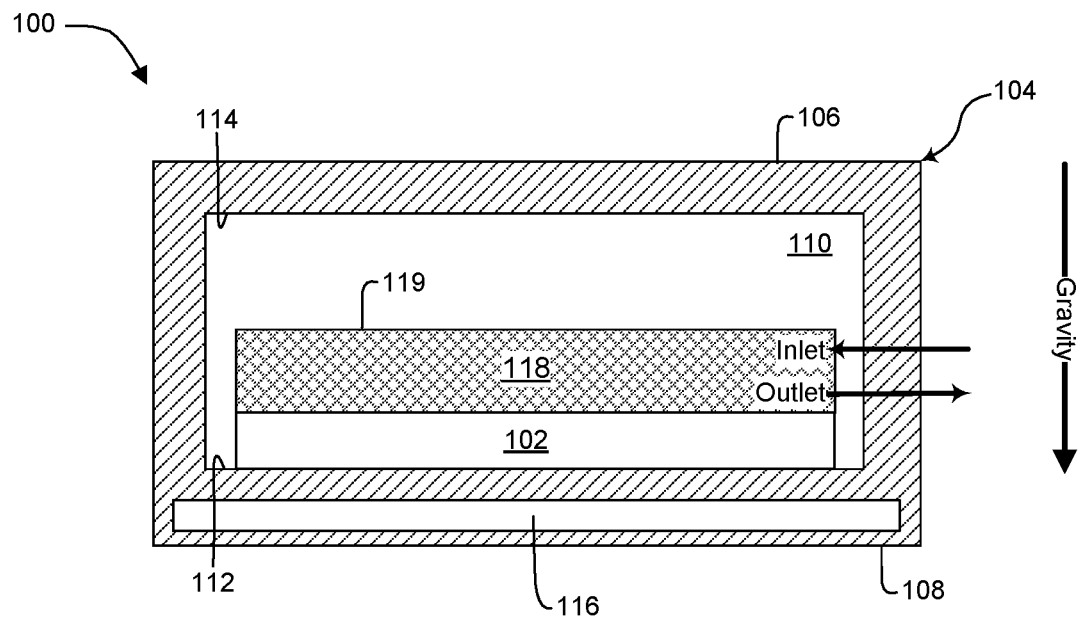
FIG. 1 is a side view of an embodiment of a thermal enclosure for vehicle electronics.

Embodiments are described of a thermal enclosure and thermal control system for vehicle electronics. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the described features, structures, or characteristics can be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiments are described below of thermal enclosure and thermal control systems for mobile computing systems (e.g., handheld computers or computers used in vehicles) to counter or mitigate the impacts of the high and low ambient temperatures and high humidities. The described embodiments use a thermal enclosure for a computing system in an autonomous driving vehicle to:

dissipate system heat and maintain functional components below their maximum allowable temperatures;

keep components above their minimum allowable temperature, all the time or for a specific duration (e.g., 24 hours, or 48 hours), against a specified lowest ambient temperature;

mitigate thermal shock due to drastic ambient temperature change;

mitigate or prevent the condensation of humidity inside the enclosure and over the electrical contact area, such as exposed solder joints, metal pins, and wires.

Embodiments of the described environmental control system can include some or all of the following features:

a cold plate with an internal fluid path and fin structures, a fluid inlet and a fluid outlet, and conformal external structures. The cold plate can attach to the major electrical components on a printed circuit board assembly (PCBA), by direct contact or via thermally conductive interface materials.

a liquid coolant loop system fluidly connected to the cold plate. The liquid coolant loop drives the liquid coolant through the cold plate via the cold plate's inlet and outlet, controls the flow rate, and maintains the return liquid coolant at a specified temperature via a heat exchanger. In a non-operating mode, the liquid coolant circulation can be shut off.

an enclosure that houses the electrical components and cold plate inside and has openings for wire/harness connectors and the inlet/outlet of the cold plate. There can be a gap between the cold plate and the enclosure. When the system is off there is no liquid circulation, the cold plate, including the non-flowing fluid inside, works as heat storage and as a thermal insulator and slows down the temperature change of the PCBA. A coating can also be applied to the cold plate surface to reduce the radiation emissivity and drop the heat loss further.

a layer of thermal insulation material embedded in the bottom shell of the enclosure or attached to the outside of the enclosure's bottom. This layer of insulation reduces the heat loss from the inside electronic system to the ambient.

a layer of phase-change material embedded in the bottom shell of the enclosure or placed between the PCBA and enclosure bottom. The phase change material may select to have a melting point of 0~10 C. This phase change material turns into the liquid phase and stores energy when ambient or system temperature is higher than its melting point and turns into the solid phase and releases energy when the ambient temperature is below its melting point. This layer of phase-change material will work as a thermal insulator and thermal shock absorber.

a layer of phase-change material placed between the cold plate and enclosure, which can work as additional heat storage in addition to the cold plate; and/or a thermoelectric cooler (TEC) such as a Peltier cooler powered and controlled by the computing system. The TEC can be placed between the cold plate and enclosure with its cold side attached to a liquid collector. There are humidity and temperature sensors integrated into the computing system, which monitors the air quality inside the enclosure. A process evaluates the risk of condensation and controls the Peltier cooler to start and create a lowest-temperature surface inside the enclosure, that condensation will occur on the Peltier cold surface and reduce the humidity inside. This way, the humidity level can be controlled beyond the point where condensation occurs at the critical area. The collected liquid can be kept there and evaporate again when the internal humidity is low or can be drained from the enclosure.

In one aspect, a thermal enclosure for use in an autonomous driving vehicle (ADV) includes an enclosure having a top, a bottom, and an interior compartment having a floor and a ceiling. The thermal enclosure is adapted to be mounted in the ADV. An electronic component is positioned in the interior compartment and thermally coupled to the floor. A cold plate with a bottom surface, a top surface, an inlet, and an outlet, is positioned in the interior compartment with the bottom surface of the cold plate thermally coupled to the electronic component and with a gap between the top surface of the cold plate and the ceiling. The inlet and the outlet are adapted to be fluidly coupled to a cooling system outside the thermal enclosure.

In an embodiment, the thermal enclosure further includes a container of phase-change material positioned between the top surface of the cold plate and the ceiling, with the container of phase-change material thermally coupled to the top surface of the cold plate. In one embodiment the phase-change material is a solid-liquid phase-change material.

In another embodiment, the thermal enclosure further includes a thermoelectric cooler positioned between the top surface of the cold plate and the ceiling and a moisture collector positioned between the top surface of the cold plate and the ceiling and thermally coupled to the thermoelectric cooler. In one embodiment the moisture collector includes a drain to transport fluid outside the thermal enclosure.

In another embodiment, the thermal enclosure further includes an auxiliary compartment between the floor of the interior compartment and the bottom of the thermal enclosure. In another embodiment the thermal enclosure further includes a phase-change material positioned in the auxiliary compartment. In another embodiment the thermal enclosure further includes a thermally insulating material positioned in the auxiliary compartment, and in yet another embodiment the thermal enclosure further includes a thermally insulating material thermally coupled to the bottom of the thermal enclosure. In an embodiment, the cooling system is the ADV's liquid cooling system.

In another aspect, an autonomous driving vehicle (ADV) includes a vehicle control system and a computer communicatively coupled to the vehicle control system. The computer is positioned in a thermal enclosure including an enclosure with a top, a bottom, and an interior compartment having a floor and a ceiling. The thermal enclosure is adapted to be mounted in the ADV. The computer is positioned in the interior compartment and is thermally coupled to the floor. A cold plate with a bottom surface, a top surface, an inlet, and an outlet, is positioned in the interior compartment with the bottom surface of the cold plate thermally coupled to the computer and with a gap between the top surface of the cold plate and the ceiling. The inlet and the outlet are adapted to be fluidly coupled to a cooling system outside the thermal enclosure.

In an embodiment, the ADV further includes a container of phase-change material positioned between the top surface of the cold plate and the ceiling, with the container of phase-change material thermally coupled to the top surface of the cold plate. In an embodiment the phase-change material is a solid-liquid phase change material.

In another embodiment, the ADV further includes a thermoelectric cooler positioned between the top surface of the cold plate and the ceiling and a moisture collector positioned between the top surface of the cold plate and the ceiling and thermally coupled to the thermoelectric cooler. In an embodiment, the moisture collector includes a drain to transport fluid outside the thermal enclosure.

In another embodiment, the ADV further includes an auxiliary compartment between the floor of the interior compartment and the bottom of the thermal enclosure. In another embodiment, the ADV further includes a phase-change material positioned in the auxiliary compartment. In another embodiment, the ADV further includes a thermally insulating material positioned in the auxiliary compartment. In yet another embodiment, the ADV further includes a thermally insulating material thermally coupled to the bottom of the thermal enclosure. In another embodiment, the cooling system is the ADV's liquid cooling system.

FIG. 1 illustrates an embodiment of a thermal enclosure 100 for controlling temperature and/or humidity of electronics in an autonomous driving vehicle (ADV). Thermal enclosure 100 includes electronics 102 positioned in a thermal enclosure 104. Thermal enclosure 104 includes a top 106, a bottom 108, and an interior compartment 110. Interior compartment 110 includes a floor 112 that is spaced apart from a ceiling 114. In the illustrated embodiment floor 112 and ceiling 114 are spaced apart and parallel to each other, but in other embodiments they need not be parallel. In the illustrated embodiment an auxiliary volume 116 is positioned between floor 112 and bottom 108, but other embodiments of thermal enclosure 100 can omit auxiliary volume 116 (see, e.g., FIG. 5).

Electronics 102 are positioned within interior compartment 110 on floor 112 in such a way that the electronics are in thermal contact with floor 112. In one embodiment, electronics 102 can include a printed circuit board assembly (PCBA) with one or more components such as processors, coprocessors, memory, etc. In one embodiment, electronics 102 can be a computer to control L4 or L5 driving of an ADV. In other embodiments, electronics 102 can be other types of safety-sensitive electronics for an ADV and in still other embodiments can be entirely different types of electronics.

A cold plate 118 is thermally coupled to electronics 102 and is positioned inside interior compartment 110 so that there is a gap between top 119 of the cold plate and ceiling 114. Cold plate 118 includes an inlet through which cooling fluid enters the cold plate and an outlet through which cooling fluid exits the cold plate. The inlet and outlet are adapted to be fluidly coupled to components outside interior compartment 110 (see, e.g., FIG. 2). In the illustrated embodiment there is a single cold plate 118 thermally coupled to a single electronic component 102—that is, there is a one-to-one correspondence between cold plate electronics. But other embodiments can have different correspondences between cold plate and electronics: there can be a many-to-one correspondence between cold plate electronics (i.e., multiple cold plates coupled to a single item of electronics); a one-to-many correspondence between cold plate and electronics (i.e., a single cold plate coupled to multiple electronics); or a many-to-many correspondence between cold plate and electronics (i.e., multiple cold plates coupled to multiple electronics).

Figure 2:
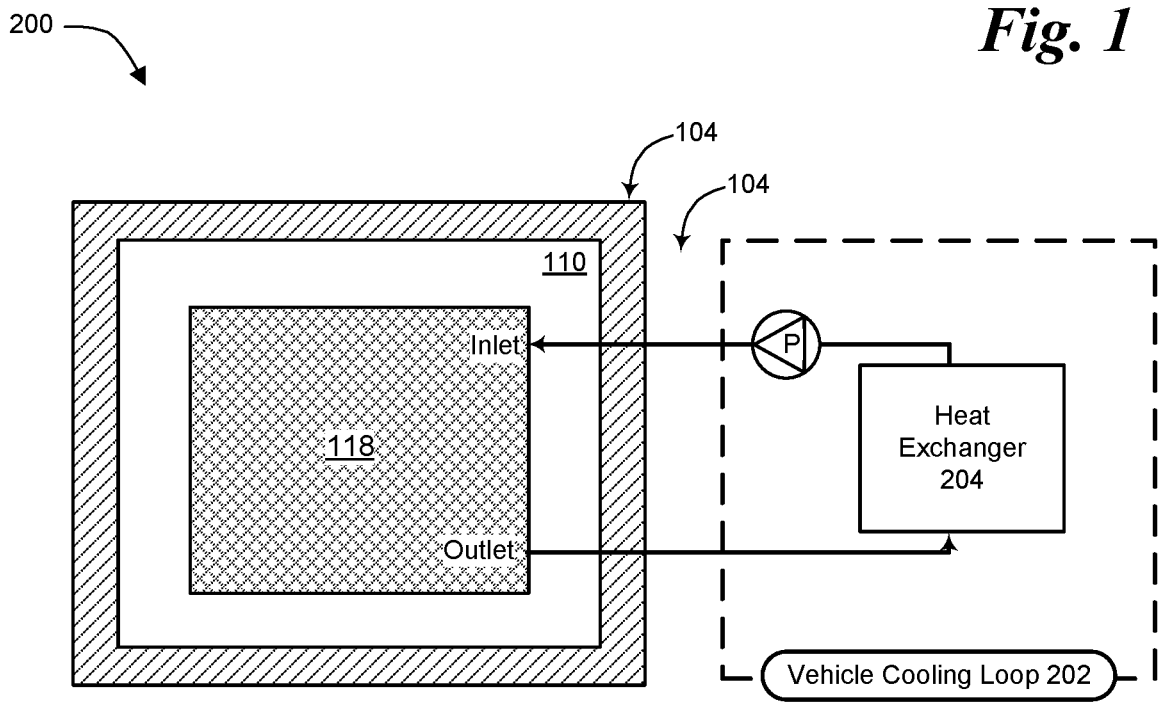
FIG. 2 is a top view of an embodiment of a thermal control system for vehicle electronics.

FIG. 2 illustrates an ADV embodiment of a thermal control system 200 using a thermal enclosure such as thermal enclosure 100. Other embodiments of thermal control system 200 can use other thermal enclosure embodiments, such as thermal enclosures 300, 400, or 500 described below. System 200 includes a thermal enclosure 100 as described above, with enclosure 104, internal compartment 110 and, in some embodiments, auxiliary compartment 116. A cold plate 118 is thermally coupled to electronics 102.

Cold plate 118 is fluidly coupled to heat exchanger 204 in vehicle cooling loop 202 to form a cooling loop. The inlet of cold plate 118 is coupled to the outlet of heat exchanger 204, and the outlet of the cold plate is fluidly coupled to the inlet of the heat exchanger. A pump P is positioned in the fluid line between heat exchanger 204 and the inlet of cold plate 118 to help circulate cooling fluid through both cold plate 118 and heat exchanger 204. In one embodiment, heat exchanger 204 is an autonomous driving vehicle's own heat exchanger—an automobile radiator, for instance—but in other embodiments heat exchanger 204 can be a heat exchanger separate from the ADV's radiator. In an ADV embodiment, pump P can be the ADV's own cooling pump, but in other embodiments pump P can be a separate pump, for instance a pump specifically dedicated to circulating cooling liquid through cold plate 118.

In operation of system 200, while electronics 102 are turned on pump P circulates a cooling fluid through cold plate 118. Heat from electronics 102 flows into the cooling fluid and the cooling fluid then flows to heat exchanger 204, which transfers heat out of the cooling fluid. The cooling fluid is then returned to cold plate 118 to absorb further heat. When the ADV is turned off—meaning that electronics 102 stop operating and pump P stops pumping—the hot but now-stagnant cooling fluid in cold plate 118 helps to maintain the temperature of electronics 102, or at least to decrease their cooling rate. The airspace inside interior compartment 110 also helps maintain the temperature and slow the cooling electronics 102.

Figure 3:
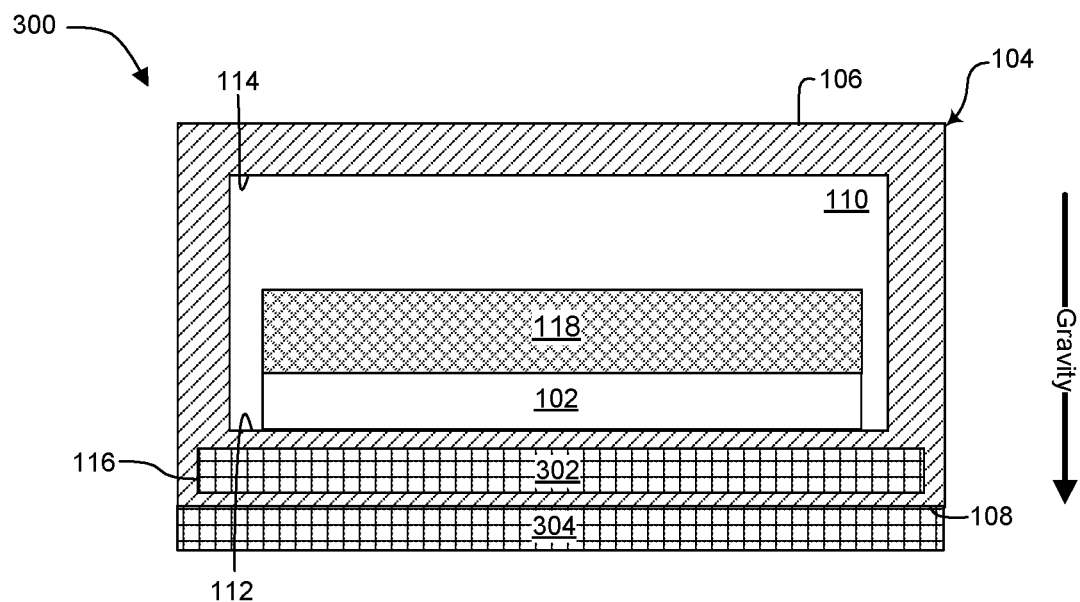
FIG. 3 is a side view of another embodiment of a thermal enclosure for vehicle electronics.

FIG. 3 illustrates another embodiment of a thermal enclosure 300 for controlling temperature and/or humidity of electronics. Thermal enclosure 300 is in most respects similar to thermal enclosure 100. It includes electronics 102 positioned in a thermal enclosure 104. Thermal enclosure 104 includes a top 106, a bottom 108, and an interior compartment 110 with a floor 112 that is spaced apart from a ceiling 114. In the illustrated embodiment floor 112 and ceiling 114 are parallel to each other, but in other embodiments they need not be parallel. An auxiliary volume 116 is positioned between floor 112 and bottom 108. As in thermal enclosure 100, other embodiments of thermal enclosure 300 can omit auxiliary volume 116 (see, e.g., FIG. 5).

The primary difference between thermal enclosures 100 and 300 is that in thermal enclosure 300 auxiliary compartment 116 is partially or fully filled with a thermally insulating material 302 and a thermally insulating material 304 partially or fully covers bottom 108. Thermal insulating materials 302 and 304 together reduce heat transfer out of interior compartment 110, cold plate 118, and electronics 102. In the illustrated embodiment both auxiliary compartment 116 and bottom 108 have thermally insulating materials, but other embodiments need not have both: in some embodiments auxiliary compartment 116 can be partially or fully filled with material 302 while bottom 108 has no thermally insulating material, and in other embodiments auxiliary compartment 116 can have no insulating material while bottom 108 has insulating material 304. In embodiments that include both thermal insulating materials 302 and 304, the two thermally insulating materials can be identical, but in other embodiments they need not be, so that thermally insulating material 302 can be different than thermally insulating material 304.

Figure 4:
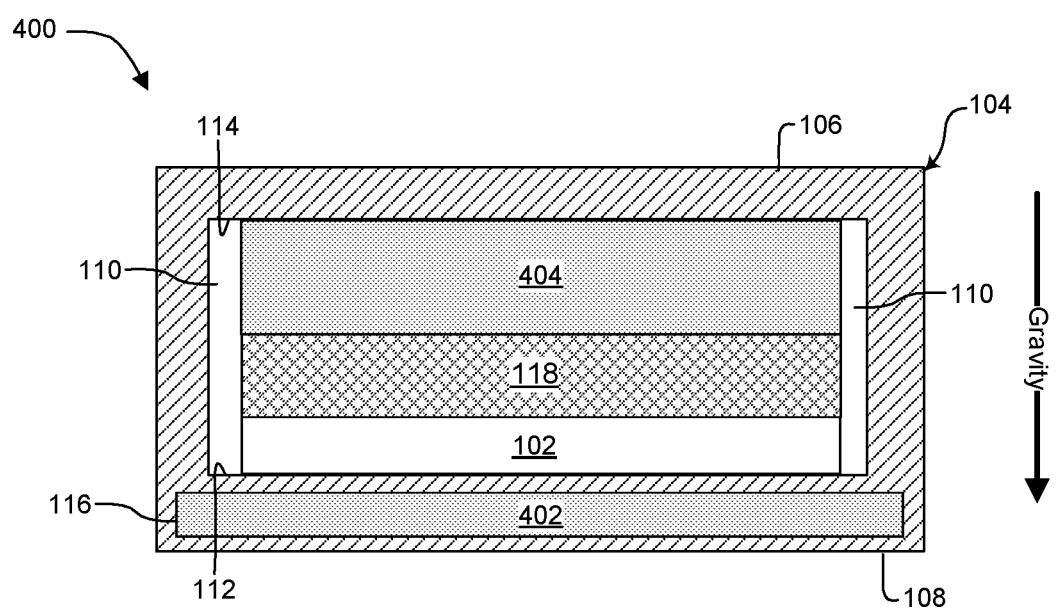
FIG. 4 is a side view of another embodiment of a thermal enclosure for vehicle electronics.

FIG. 4 illustrates another embodiment of a thermal enclosure 400 for controlling temperature and/or humidity of electronics. Thermal enclosure 400 is in most respects similar to thermal enclosures 100 and 300. It includes electronics 102 positioned in a thermal enclosure 104. Thermal enclosure 104 includes a top 106, a bottom 108, and an interior compartment 110 with a floor 112 that is spaced apart from a ceiling 114. In the illustrated embodiment floor 112 and ceiling 114 are parallel to each other, but in other embodiments they need not be parallel. An auxiliary volume 116 is positioned between floor 112 and bottom 108. As in thermal enclosure 100, other embodiments of thermal enclosure 400 can omit auxiliary volume 116 (see, e.g., FIG. 5).

The primary difference between thermal enclosure 400 and thermal enclosures 100 and 300 is that in thermal enclosure 400 auxiliary compartment 116 is partially or fully filled with a phase change material 402 and a container 404 partially or fully filled with a phase-change material 404 is positioned between cold plate 118 and ceiling 114. In the illustrated embodiment container 404 spans the entire distance between cold plate 118 and ceiling 114, but in other embodiment it need not span the entire distance. The illustrated embodiment includes phase-change material in auxiliary compartment 116 and in container 404, but other embodiments need not include phase-change material in both places: other embodiments can include phase-change material 402 but omit container 404, and still other embodiments can include container 404 but omit phase-change material 402.

In one embodiment, phase-change materials 402 and 404 are materials that change from a solid phase to a liquid phase upon absorbing heat, but in other embodiments they can be materials that change from a liquid phase to a vapor phase upon absorbing heat. In one embodiment phase-change materials 402 and 404 can be the same phase-change material, but in other embodiments phase-change material 402 can be different than phase-change material 304.

During operation of electronics 102 in thermal enclosure 400, heat from electronics 102 is transferred into phase-change materials 402 and 404, which absorb the heat and change phase. When electronics 102 stop operating, heat from phase-change materials 402 and 404, including latent heat released as the phase-change materials cool down and return to their original phases, is released into electronics 102 and interior compartment 110, thus maintaining the temperature of electronics 102 or slowing their cooling.

Figure 5:
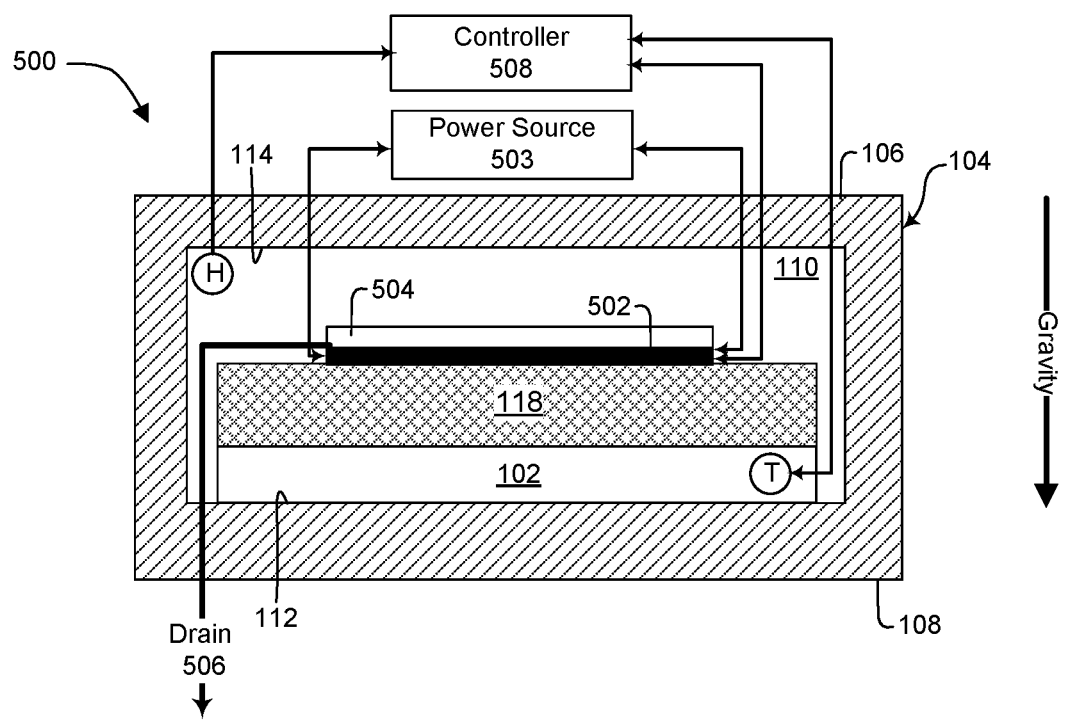
FIG. 5 is a side view of another embodiment of a thermal enclosure for vehicle electronics.

FIG. 5 illustrates another embodiment of a thermal enclosure 500 for controlling temperature and/or humidity of electronics. Thermal enclosure 400 is in most respects similar to thermal enclosures 100, 300, and 400. It includes electronics 102 positioned in a thermal enclosure 104. Thermal enclosure 104 includes a top 106, a bottom 108, and an interior compartment 110 with a floor 112 that is spaced apart from a ceiling 114. In the illustrated embodiment floor 112 and ceiling 114 are parallel to each other, but in other embodiments they need not be parallel. As in thermal enclosure 100, other embodiments of thermal enclosure 500 can omit auxiliary volume 116.

The primary differences between thermal enclosure 500 and thermal enclosures 100, 300, and 400 are that thermal enclosure 500 omits auxiliary compartment 116 and includes active (as opposed to passive) temperature control elements. Thermal enclosure 500 includes a thermoelectric cooler (TEC) 502 positioned in interior compartment 110. In the illustrated embodiment TEC 502 is positioned on top of cold plate 118, but in other embodiments it can be positioned differently. In one embodiment TEC 502 can be a Peltier cooler, but in other embodiments it can be a different type of thermoelectric cooler. TEC 502 is electrically coupled to a power source 503. In the illustrated embodiment power source 503 is shown as a unit separate from controller 508, but in other embodiments power source 503 can be integrated in the controller. In one embodiment power source 503 can be a battery, but in other embodiments it can be another type of power source. Although not shown in the figure, in some embodiments, such as when power source 503 is a battery, the power source can also be electrically coupled to other power sources. In an embodiment where power source 503 is a battery, when electronics 102 cease operation thermoelectric cooler (TEC) 502 has its hot surface attached to the cold plate 118 and, powered by the battery, works as a heater to maintain temperature or slow down the temperature drop rate. In this battery embodiment, the combination of TEC 502 plus battery 503 works as an energy storage device in which battery 503 charges during operation of electronics 102 and discharges energy as a heat storage mode when electronics 102 are not operating. In one embodiment the discharging or heating process can be initiated by a temperature-sensor controlled switch, which can be implemented in controller 508 or separately.

TEC 502 has its cold side thermally coupled to a moisture collector 504. When TEC is operating, moisture collector 504 collects moisture that condenses from the air within the interior compartment. In one embodiment moisture collector 504 can be a pan with upturned edges that sits on the cold side of TEC 502, but in other embodiments moisture collector 504 can have a different construction. In the illustrated embodiment moisture collector 504 is fluidly coupled to a drain 506 that allows collected moisture to be removed from interior compartment 110 to the exterior of thermal enclosure 104. Other embodiments of thermal enclosure 500 need not include drain 506, instead allowing the collected moisture to remain in moisture collector 504.

To control the operation of TEC 502, thermal enclosure 500 includes several control elements. A temperature sensor T is position in or on electronics 102 and a humidity sensor H is positioned in interior compartment 110. In the illustrated embodiment humidity sensor H is positioned separately from electronics 102, but in other embodiments it can be positioned elsewhere, such as in or on electronics 102. Humidity sensor H can be sensor that directly sensors humidity or one that sensors a humidity proxy such as dewpoint.

TEC 502, temperature sensor T and humidity sensor H are all communicatively coupled to a controller 508, which directs the operation of TEC 502 based on inputs from temperature sensor T and humidity sensor H. In the illustrated embodiment controller 508 is outside interior compartment 110 and is separate from electronics 102, but in other embodiments controller 508 can be positioned inside interior compartment 110. In some embodiments controller 508 can be a hardware component that is part of electronics 102, and in other embodiments controller 508 can be implemented as software running on electronics 102.

Figure 6:
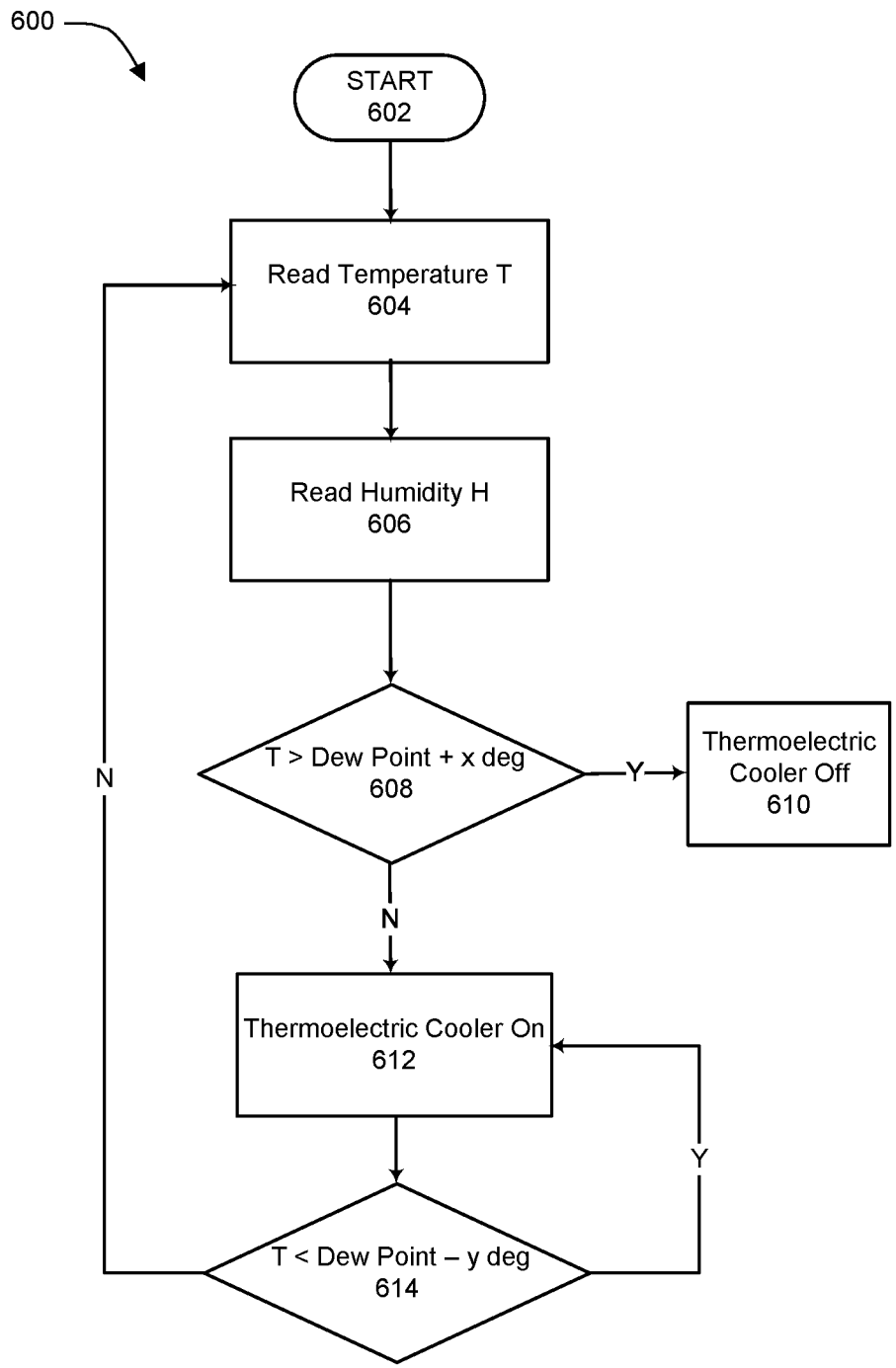
FIG. 6 is a flowchart of an embodiment of a process for operating the embodiment of a thermal enclosure of FIG. 5.

FIG. 6 illustrates, in flowchart form, an embodiment of a process 600 for operating a thermal enclosure such as thermal enclosure 500. The process begins at block 602. At block 604 the process measures the temperature at temperature sensor T and at block 606 the process measures the humidity, or a humidity proxy such as the dew point, at humidity sensor H.

At block 608 the process checks whether the current temperature T exceeds the dewpoint by at least a temperature tolerance x. If at block 608 the temperature exceeds the dew point by x or more degrees, then the process moves to block 610, where the thermoelectric cooler is turned off. But if at block 608 the temperature does not exceed the dew point by x or more degrees, the process moves to block 612, where the thermoelectric cooler is turned on. At block 614 the process checks whether the temperature is at least y degrees below the dew point. If at block 614 the temperature has not risen above y degrees below the dew point, the process returns to block 612. But if at block 614 the temperature has risen above y degrees below the dew point, then the process returns to block 604.

Figure 7:
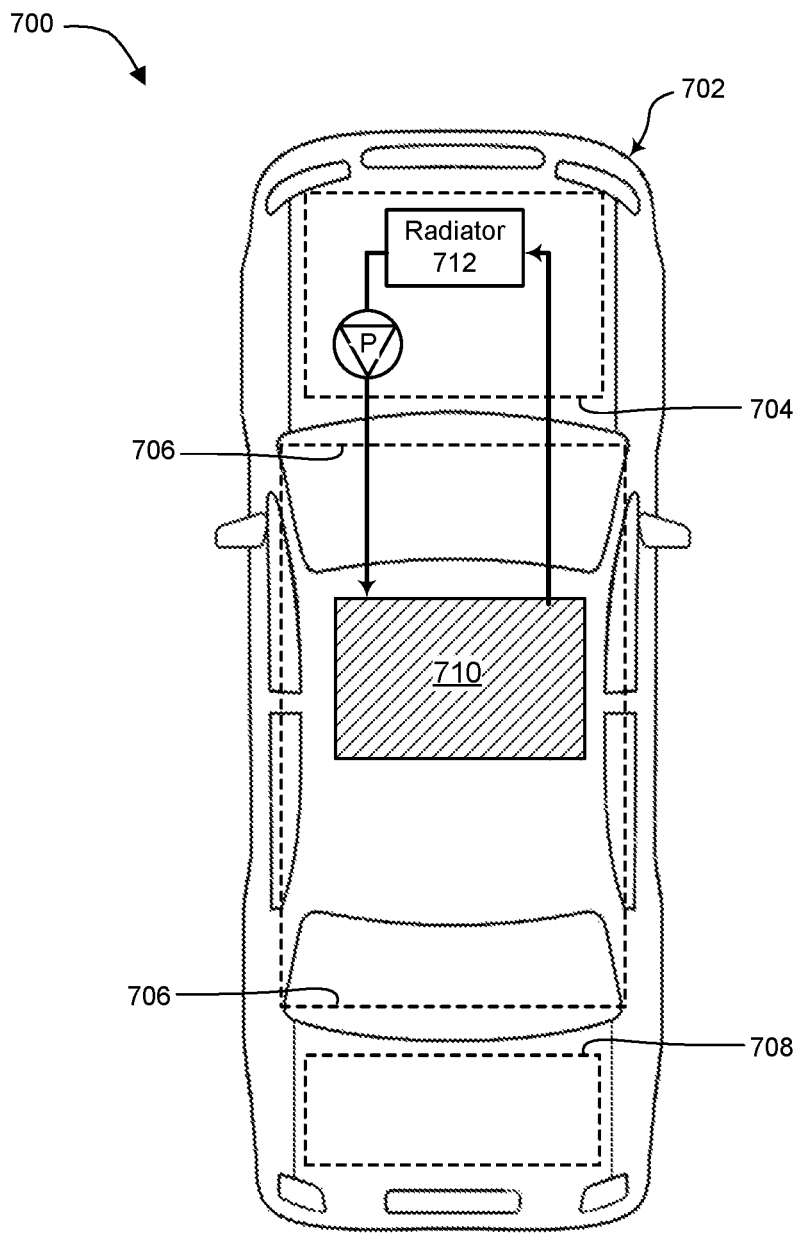
FIG. 7 is a top view of an embodiment of an autonomous driving vehicle (ADV) including an embodiment of an environmental control system.

FIG. 7 illustrates an embodiment of an autonomous driving vehicle (ADV) 700 with a thermal control system such as thermal control system 200 (see FIG. 2). ADV 700 includes a vehicle chassis 702 within which there are several compartments. The illustrated embodiment has three compartments: an engine compartment 704 at or near the front of the chassis, a passenger compartment 706 in the middle of the chassis, and a trunk compartment 708 at or near the rear of chassis 702. Other embodiments of ADV 700 can, of course, have a different number and arrangement of compartments; for instance, in a rear-engine vehicle engine compartment 704 can be at the rear instead of the front, and in a mid-engine vehicle engine compartment 704 can be in the middle of the chassis, for instance surrounded by the passenger compartment.

In the illustrated embodiment a thermal enclosure 710 is positioned in passenger compartment 706; thermal enclosure 710 can be implemented with any of thermal enclosures 100, 300, 400, or 500 described above. In one embodiment the electronics within thermal enclosure are computing hardware for level four (L4) and level five (L5) fully autonomous driving (i.e., driverless) platforms. Although not illustrated in the drawing, in these embodiments, the L4 or L5 computing hardware can be coupled to a vehicle control system so that the computing hardware can control the speed, direction, or other handling characteristics of ADV 700.

Thermal enclosure 710—or, more specifically, the cold plate within the thermal enclosure—is fluidly coupled to radiator 712, with the inlet of radiator 712 coupled to the outlet of thermal enclosure 710 (i.e., to the outlet of the cold plate) and the outlet of radiator 712 fluidly coupled to the inlet of thermal enclosure 710 (i.e., to the inlet of the cold plate). A pump P is coupled in the fluid line between the outlet of the radiator and the inlet of thermal enclosure 710 to circulate cooling fluid through both radiator 712 and thermal enclosure 710 when the ADV is operating, substantially as described above for thermal control system 200.

The above description of embodiments is not intended to be exhaustive or to limit the invention to the described forms. Specific embodiments of, and examples for, the invention are described herein for illustrative purposes, but various modifications are possible.

What is claimed is:

1. A thermal enclosure for use in an autonomous driving vehicle (ADV), the thermal enclosure comprising:
   an enclosure having a top, a bottom, and an interior compartment having a floor and a ceiling, the thermal enclosure being adapted to be mounted in the ADV;
   an electronic component positioned in the interior compartment and thermally coupled to the floor;
   a cold plate having a bottom surface, a top surface, an inlet, and an outlet, wherein the cold plate is positioned in the interior compartment with the bottom surface of the cold plate thermally coupled to the electronic component and with a gap between the top surface of the cold plate and the ceiling, and wherein the inlet and the outlet are adapted to be fluidly coupled to a cooling system outside the thermal enclosure.

2. The thermal enclosure of claim 1, further comprising a container of phase-change material positioned between the top surface of the cold plate and the ceiling, wherein the container of phase-change material is thermally coupled to the top surface of the cold plate.

3. The thermal enclosure of claim 2 wherein the phase-change material is a solid-liquid phase-change material.

4. The thermal enclosure of claim 1, further comprising:
   a thermoelectric cooler positioned between the top surface of the cold plate and the ceiling;
   a moisture collector positioned between the top surface of the cold plate and the ceiling and thermally coupled to the thermoelectric cooler.

5. The thermal enclosure of claim 4 wherein the moisture collector includes a drain to transport fluid outside the thermal enclosure.

6. The thermal enclosure of claim 1, further comprising an auxiliary compartment between the floor of the interior compartment and the bottom of the thermal enclosure.

7. The thermal enclosure of claim 6, further comprising a phase--change material positioned in the auxiliary compartment.

8. The thermal enclosure of claim 6, further comprising a thermally insulating material positioned in the auxiliary compartment.

9. The thermal enclosure of claim 8, further comprising a thermally insulating material thermally coupled to the bottom of the thermal enclosure.

10. The thermal enclosure of claim 1 wherein the cooling system is the ADV's liquid cooling system.

11. An autonomous driving vehicle (ADV) comprising:
    a vehicle control system;
    a computer communicatively coupled to the vehicle control system, the computer being positioned in a thermal enclosure including:
       an enclosure having a top, a bottom, and an interior compartment having a floor and a ceiling, the thermal enclosure being adapted to be mounted in the ADV, wherein the computer is positioned in the interior compartment and thermally coupled to the floor;
       a cold plate having a bottom surface, a top surface, an inlet, and an outlet, wherein the cold plate is positioned in the interior compartment with the bottom surface of the cold plate thermally coupled to the computer and with a gap between the top surface of the cold plate and the ceiling, and wherein the inlet and the outlet are adapted to be fluidly coupled to a cooling system outside the thermal enclosure.

12. The autonomous driving vehicle of claim 11, further comprising a container of phase-change material positioned between the top surface of the cold plate and the ceiling, wherein the container of phase-change material is thermally coupled to the top surface of the cold plate.

13. The autonomous driving vehicle of claim 12 wherein the phase-change material is a solid-liquid phase change material.

14. The autonomous driving vehicle of claim 11, further comprising:
 a thermoelectric cooler positioned between the top surface of the cold plate and the ceiling;
 a moisture collector positioned between the top surface of the cold plate and the ceiling and thermally coupled to the thermoelectric cooler.

15. The autonomous driving vehicle of claim 14 wherein the moisture collector includes a drain to transport fluid outside the thermal enclosure.

16. The autonomous driving vehicle of claim 11, further comprising an auxiliary compartment between the floor of the interior compartment and the bottom of the thermal enclosure.

17. The autonomous driving vehicle of claim 16, further comprising a phase-change material positioned in the auxiliary compartment.

18. The autonomous driving vehicle of claim 16, further comprising a thermally insulating material positioned in the auxiliary compartment.

19. The autonomous driving vehicle of claim 18, further comprising a thermally insulating material thermally coupled to the bottom of the thermal enclosure.

20. The autonomous driving vehicle of claim 11 wherein the cooling system is the ADV's liquid cooling system.

* * * * *